United States Patent
Matsumori et al.

(10) Patent No.: US 9,743,569 B2
(45) Date of Patent: Aug. 22, 2017

(54) ELECTRONIC COMPONENT SUPPLY APPARATUS

(71) Applicant: PANASONIC INTELLECTUAL PROPERTY MANAGEMENT CO., LTD., Osaka (JP)

(72) Inventors: Masashi Matsumori, Osaka (JP); Takashi Nakamura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/880,464

(22) Filed: Oct. 12, 2015

(65) Prior Publication Data

US 2016/0198597 A1     Jul. 7, 2016

(30) Foreign Application Priority Data

Jan. 6, 2015  (JP) ................................. 2015-001165
Jan. 8, 2015  (JP) ................................. 2015-002001

(51) Int. Cl.
| | | |
|---|---|---|
| H05K 13/04 | (2006.01) | |
| H05K 13/08 | (2006.01) | |
| B65H 37/00 | (2006.01) | |

(52) U.S. Cl.
CPC ....... *H05K 13/0417* (2013.01); *B65H 37/002* (2013.01); *H05K 13/08* (2013.01)

(58) Field of Classification Search
CPC .......................... H05K 13/021; H05K 13/0417
USPC ........................................................ 414/810
See application file for complete search history.

(56) References Cited

U.S. PATENT DOCUMENTS

| | | | |
|---|---|---|---|
| 7,220,095 B2 | 5/2007 | Lyndaker et al. | |
| 7,850,040 B2* | 12/2010 | Davis ................. | H05K 13/0417 221/72 |
| 8,269,973 B2* | 9/2012 | Kou ...................... | B65H 26/02 356/445 |
| 9,055,709 B2* | 6/2015 | Shin ..................... | B65H 37/002 |
| 9,310,789 B2* | 4/2016 | Shimizu ................ | G05B 15/02 |

(Continued)

FOREIGN PATENT DOCUMENTS

JP     2014-011291 A     1/2014

*Primary Examiner* — Timothy Waggoner
(74) *Attorney, Agent, or Firm* — Pearne & Gordon, LLP

(57) ABSTRACT

An electronic component supply apparatus transports a component supply tape which has accommodation sections and sprocket holes formed at regular intervals and which accommodates electronic components in the accommodation sections and is covered with a cover tape, to a component picking-up position and supplies each of the electronic components accommodated in each of the accommodation sections to a component mounting apparatus. The electronic component supply apparatus includes an electronic component detecting unit that detects the electronic component accommodated in the accommodation section of the component supply tape which has yet to pass the cover tape processing unit on a transport path; a determination unit that determines presence or absence of an electronic component in the accommodation section based on information from the electronic component detecting unit; and a control unit that controls a component supply tape transport unit based on a determination result of the determination unit.

10 Claims, 9 Drawing Sheets

(56) References Cited

U.S. PATENT DOCUMENTS

2003/0219330 A1* 11/2003 Lyndaker ........... H05K 13/0417
                                              414/411

* cited by examiner

ELECTRONIC COMPONENT SUPPLY APPARATUS

CROSS-REFERENCES TO RELATED APPLICATION(S)

This application is based on and claims priority from Japanese Patent Application No. 2015-001165 filed on Jan. 6, 2015 and Japanese Patent Application No. 2015-002001 filed on Jan. 8, 2015, the entire contents of which are incorporated herein by reference.

BACKGROUND

1. Field of the Invention

One or more embodiments of the present invention relate to an electronic component supply apparatus that transports a component supply tape having an accommodation section in which an electronic component is accommodated and that supplies the electronic component to a component mounting apparatus.

2. Description of Related Art

As an electronic component supply apparatus of a component mounting apparatus that mounts an electronic component on a substrate, a tape feeder that supplies a type of a component supply tape having a pocket-like accommodation section, in which the electronic component is accommodated, is widely used. The component supply tape is set to be in a state of being wound and accommodated on a reel and having a predetermined length, and a mounting head of the component mounting apparatus picks up the electronic component from the component supply tape transported to a component picking-up position by the tape feeder. Then, when the component supply tape accommodated on one reel is completely unwound and the components are depleted in the component supply tape, reel replacement is performed, in which a new reel is set and the next component supply tape is additionally supplied.

In the reel replacement, discharging a preceding component supply tape, from which a component at the tailing end portion is picked up, that is, "empty tape discharge", or sending the leading component of a subsequently supplied component supply tape to the component picking-up position, that is, "heading of component", is performed by an operator. In order to enhance operation efficiency through significant laborsaving in such reel replacement, various measures have been taken in the related art (see Patent Document 1, for instance). Patent Document 1 discloses a related art, as an example, in which, after the terminal end portion of a preceding component supply tape is detected, whether or not an electronic component is present in an accommodation section (pocket) of the component supply tape is detected in response to a suction nozzle of a mounting head performing or not performing suction of a component and, when it is determined that there is no electronic component from the detection result, the preceding depleted component supply tape is rapidly discharged from the tape feeder.

Patent Document 1 is JP-A-2014-11291.

SUMMARY

However, the above-described related art has the following difficulties. That is, in the related art, component detection required to determine a timing to discharge the depleted component supply tape as an empty tape, is performed in response to the suction nozzle performing or not performing suction of a component. In a case where an empty accommodation section is detected predetermined consecutive times, the component depletion in the component supply tape is determined. Hence, there is a need to repeatedly perform the component suction operation which causes the mounting head to lift and lower the suction nozzle from and to empty accommodation sections, which is unnecessary for a normal operation, and thus, time is unavoidably wasted. Thus, the component detection by the suction nozzle has difficulties in detection accuracy in that the presence or absence of the component is not completely detected in a reliable manner. In such the related art, it is difficult to perform efficient and reliable detection of the presence or absence of an electronic component in the accommodation section of the component supply tape and, as a result, it is difficult to avoid wasting time in the "heading of component" and the "empty tape discharge" during the reel replacement. Hence, improvement of productivity is impeded.

One or more embodiments of the present invention aim to provide an electronic component supply apparatus in which it is possible to position the leading component of a component supply tape and to discharge an empty tape, from which the final component has been picked up, without wasting time, such that it is possible to improve productivity.

According to an aspect of the embodiments, there is provided an electronic component supply apparatus that transports a component supply tape which has a plurality of accommodation sections and which accommodates electronic components in the accommodation sections and is covered with a cover tape, to a component picking-up position and that supplies each of the electronic components accommodated in each of the accommodation sections to a component mounting apparatus, the electronic component supply apparatus including: a main body unit which is provided with a transport path that guides the component supply tape from an insertion port, through which the component supply tape is inserted, to a discharge port, through which the component supply tape is discharged; a component supply tape transport unit that transports the component supply tape inserted through the insertion port toward the discharge port and that positions the accommodation section at the component picking-up position on an upstream side from the discharge port; a cover-tape processing unit that peels off or cuts open the cover tape of the component supply tape which has yet to reach the component picking-up position and that exposes the electronic component accommodated in the accommodation section; an electronic component detecting unit that detects the electronic component accommodated in the accommodation section of the component supply tape which has yet to pass the cover tape processing unit on the transport path; a determination unit that determines presence or absence of an electronic component in the accommodation section based on information from the electronic component detecting unit; and a control unit that controls the component supply tape transport unit based on a determination result of the determination unit.

According to the embodiments, it is possible to position the leading component of a component supply tape and to discharge an empty tape from which the final component has been picked up without wasting time to improve productivity.

DETAILED DESCRIPTION

Next, an embodiment of the present invention will be described with reference to the drawings. First, a configuration of a tape feeder 1 as an electronic component supply apparatus will be described with reference to FIG. 1. The tape feeder 1 has functions of transporting a component supply tape 20 (refer to FIGS. 2A to 2C) having accommodation sections in which electronic components are accommodated, to a component picking-up position, and of supplying the electronic components accommodated in the accommodation sections to a component mounting apparatus.

Figure 1:
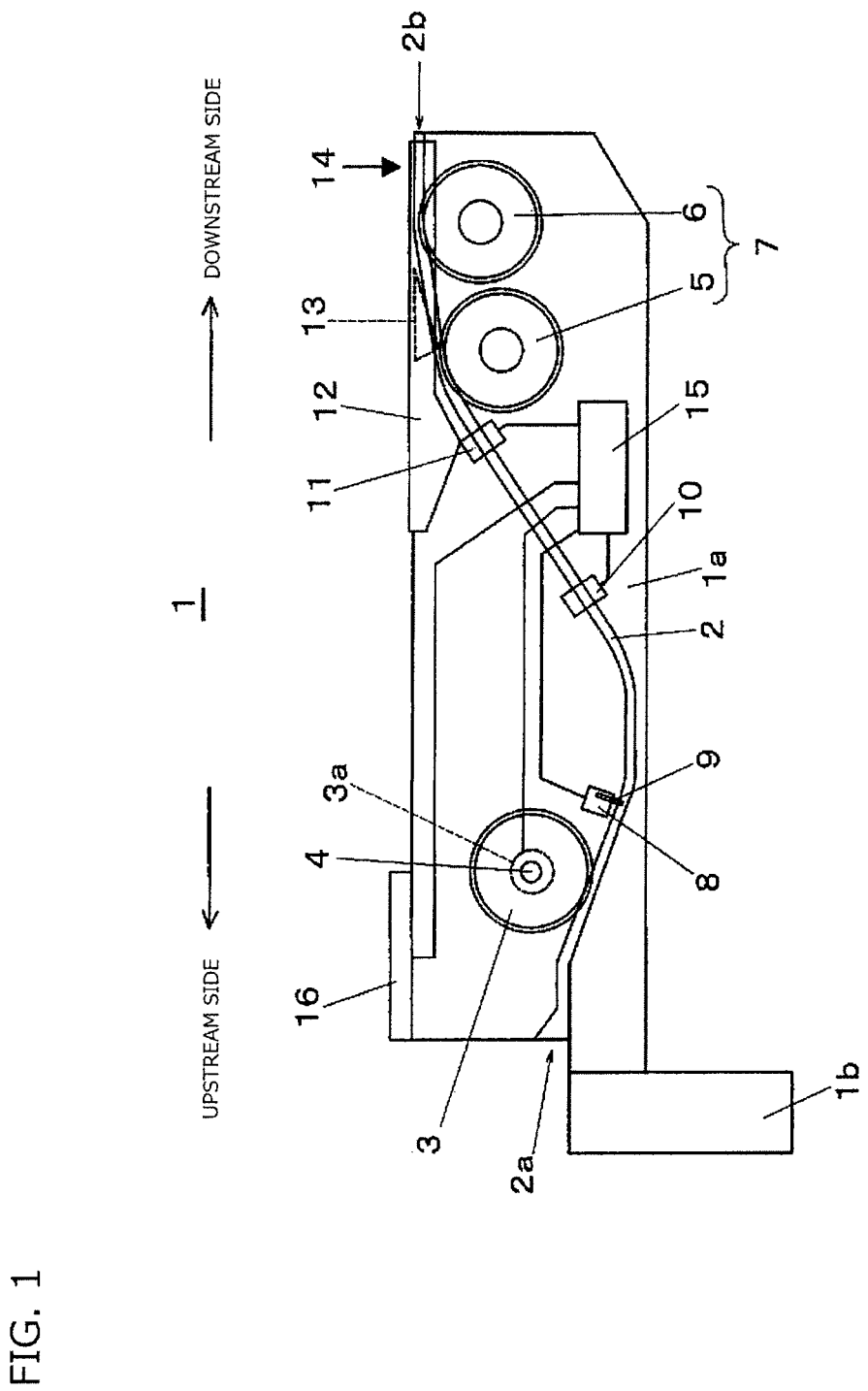
FIG. 1 is an explanatory diagram illustrating a configuration of an electronic component supply apparatus of an embodiment of the present invention.

As illustrated in FIG. 1, the tape feeder 1 is configured to include a main body unit 1a and a mounting section 1b provided to protrude downward from an undersurface of the main body unit 1a. In a state in which the undersurface of the main body unit 1a is mounted along a feeder base of the component mounting apparatus (not illustrated), the tape feeder 1 is fixed to and mounted on the feeder base, and an internal controller 15 for controlling tape feeding in the tape feeder 1 is connected to an apparatus controller (not illustrated) of the component mounting apparatus. An operation/display panel 16 connected to the controller 15 is provided on the top surface of the main body unit 1a and enables operational input or display required for operation or state display of the tape feeder 1 to be performed.

A transport path 2 that guides the component supply tape 20 inserted into the tape feeder 1 is provided inside the main body unit 1a. The transport path 2 is provided to communicate between an insertion port 2a which is opened at an end portion of the tape feeder 1 on an upstream side (left side in FIG. 1) in a tape feeding direction and through which the component supply tape 20 is inserted, and a discharge port 2b which is opened at an end portion on a downstream side and through which the component supply tape 20 is discharged.

A feeding sprocket 3 is disposed on the upstream side of the transport path 2 in the vicinity of the insertion port 2a. The feeding sprocket 3 is mounted, through a one-way clutch mechanism, on a drive shaft 4 which is driven by a feeding motor 3M (refer to FIG. 7). A feeding sprocket sensor 3a is provided at a joining portion between the feeding sprocket 3 and the drive shaft 4 and is configured to include an encoder which detects that the component supply tape 20 inserted through the insertion port 2a engages with the feeding sprocket 3. The feeding sprocket sensor 3a detects the engagement of the component supply tape 20 with the feeding sprocket 3 and thereby, the feeding motor 3M starts driving. In this manner, the component supply tape 20 is transported to the downstream side, that is, toward the discharge port 2b along the transport path 2.

In the tape feeding of the component supply tape 20 by the feeding sprocket 3, the feeding sprocket 3 is joined to the drive shaft 4 through the one-way clutch mechanism. The one-way clutch mechanism allows the drive shaft 4 of the feeding sprocket 3 to only rotate in a direction relative to the tape feeding direction. In this manner, a drive force transmitted from the drive shaft 4 to the feeding sprocket 3 is limited to rotation in the tape feeding direction. In addition, since the feeding sprocket 3 is freely rotatable in the tape feeding direction regardless of the rotation of the drive shaft 4, the component supply tape 20 engaging with the feeding sprocket 3 moves in the tape feeding direction with no impediment. In the configuration described above, the feeding sprocket 3 driven by the feeding motor 3M functions as an inserted tape feeding unit that transports the component supply tape 20 inserted through the insertion port 2a toward the discharge port 2b along the transport path 2.

A following-tape detecting sensor 8 and a following-tape stopper 9 are disposed on the downstream side of the transport path 2 from the feeding sprocket 3. In a state in which the tape feeding of a preceding component supply tape 20 (hereinafter, described as a preceding tape 20 (1)) fed as a component picking-up target is continuously performed, the following-tape stopper 9 has a function of causing a leading end portion of a following component supply tape 20 (hereinafter, described as a following tape 20 (2)) additionally inserted through the insertion port 2a to come into contact with the following-tape stopper 9 and to stop the following tape 20 (2). The following-tape detecting sensor 8 detects that the following tape 20 (2) stopped in contact with the following-tape stopper 9 is present.

An intermediate sensor 10 is disposed on the downstream side on the transport path 2 from the following-tape stopper 9, and a sensor unit 11 is disposed further on the downstream side from the intermediate sensor 10. The intermediate sensor 10 corresponds to a tape detecting sensor and detects shapes regularly formed on the component supply tape 20 of end portions of the component supply tape 20, that is, a terminal end portion of the preceding tape 20 (1) and a leading end portion of the following tape 20 (2), further, an accommodation section 21a, a sprocket hole 21b, or the like, substantially at an intermediate position of the transport path 2 and thereby the intermediate sensor 10 detects that the component supply tape 20 is present or has passed through. As the tape detecting sensor, a sensor other than the intermediate sensor 10 may be disposed on the transport path 2 as long as the sensor has a function of detecting the component supply tape 20.

Figure 2A:
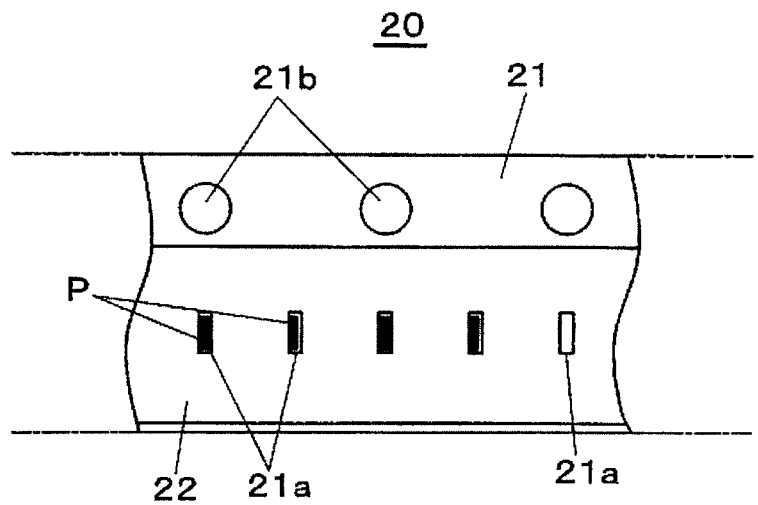
FIGS. 2A to 2C are explanatory diagrams illustrating configurations of component supply tapes as supply targets of the electronic component supply apparatus of the embodiment of the present invention.
Figure 2B:
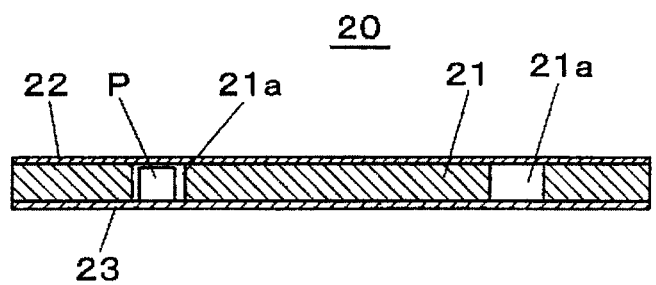

The sensor unit 11 detects the presence or absence of an electronic component P in the accommodation section 21a (refer to FIGS. 2A and 2B) of the component supply tape 20 having the following configuration. Here, with reference to FIGS. 2A and 2B, the configuration of the component supply tape 20 is described. As illustrated in FIG. 2A and FIG. 2B, the component supply tape 20 has a base paper tape 21 as a main body, in which the accommodation sections 21a for accommodating the electronic components P and sprocket holes 21b for tape feeding are formed at regular intervals. Here, two accommodation sections 21a are formed, for example, in one pitch of the sprocket hole 21b.

A cover tape 22 and a bottom tape 23 adhere to the top surface and the undersurface of the base tape 21, respectively, within a range in which the accommodation sections 21a are formed such that the electronic components P accommodated in the accommodation sections 21a are prevented from dropping out. Before the electronic component P is picked up out of the component supply tape 20, the cover tape 22 is peeled off from the base tape 21. That is, the target component supply tape 20 according to the present embodiment is configured to have a plurality of accommodation sections 21a in which the electronic components P are accommodated and the sprocket holes 21b formed at regular intervals and to accommodate the electronic components P in the accommodation sections 21a and to cover the electronic components P with the cover tape 22.

Both the cover tape 22 and the bottom tape 23 are optically transparent such that light radiating from below the bottom tape 23 is transmissible to the upper side through a space inside the accommodation section 21a and the cover tape 22. In the tape feeder 1 of the present embodiment, the light radiating from below the bottom tape 23 is received on the upper side of the cover tape 22 such that the presence or absence of the electronic component P in the accommodation section 21a is detected.

Figure 2C:
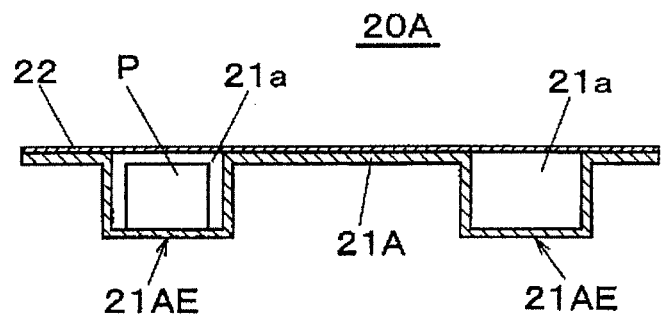

A component supply tape 20A illustrated in FIG. 2C corresponds to an embossed type tape used to supply relatively large-sized electronic components. Embossed sections 21AE, in which each of the accommodation sections 21a inside which each of the electronic components P can be accommodated, are formed, are provided in a base tape 21A. In the component supply tape 20A, the cover tape 22 also adheres to the top surface thereof within a range in which the accommodation sections 21a are formed. Both the base tape 21A and the cover tape 22 are optically transparent or an opening is provided in the bottom of the embossed section 21AE such that light radiating from below the base tape 21A is transmittable to the upper side through the space inside the accommodation section 21a and the cover tape 22.

A transport sprocket mechanism 7 is provided on the downstream side of the sensor unit 11 and is configured to cause a transport motor 7M (refer to FIG. 7) as the same drive source to drive a first sprocket 5 and a second sprocket 6. The component supply tape 20 is inserted through the insertion port 2a and is fed along the transport path 2 by the feeding sprocket 3 and the leading end portion of the tape reaches the transport sprocket mechanism 7. Then, the component supply tape 20 engages with the first sprocket 5 and the second sprocket 6 to be further fed to the downstream side and is transported to a component picking-up position 14 set on the upstream side from the discharge port 2b. A cover member 12 covers the upper side of the transport sprocket mechanism 7 and a cover-tape processing unit 13 is disposed on a back surface of the cover member 12.

A peeling claw of the cover-tape processing unit 13 peels off the cover tape 22 or a cutting blade cuts open the cover tape 22, on the upstream side of the component picking-up position 14, from the component supply tape 20 which is fed by the transport sprocket mechanism 7, thereby the electronic component P accommodated in the accommodation section 21a is exposed. In this manner, it is possible to pick up the electronic component P by a mounting head (not illustrated) provided in the component mounting apparatus, from the accommodation section 21a fed to the component picking-up position 14. That is, the cover-tape processing unit 13 has functions of peeling off or cutting open the cover tape 22 of the component supply tape 20 which has yet to reach the component picking-up position 14 and of exposing the electronic component P accommodated in the accommodation section 21a.

In the configuration described above, the transport sprocket mechanism 7 corresponds to a component supply tape transport unit that transports the component supply tape 20 transported along the transport path 2, toward the discharge port 2b and positions the accommodation section 21a at the component picking-up position 14 on the upstream side from the discharge port 2b. Then, the feeding sprocket 3 as the inserted tape feeding unit and the transport sprocket mechanism 7 as the component supply tape transport unit configure a component supply tape transport unit that transports the component supply tape 20 inserted through the insertion port 2a toward the discharge port 2b and positions the accommodation section 21a at the component picking-up position 14 on the upstream side from the discharge port 2b. The feeding sprocket 3 and the transport sprocket mechanism 7 can perform both continuous transport in which the component supply tape 20 is continuously fed and pitch transport in which the component supply tape 20 is intermittently fed, as necessary.

Figure 3A:
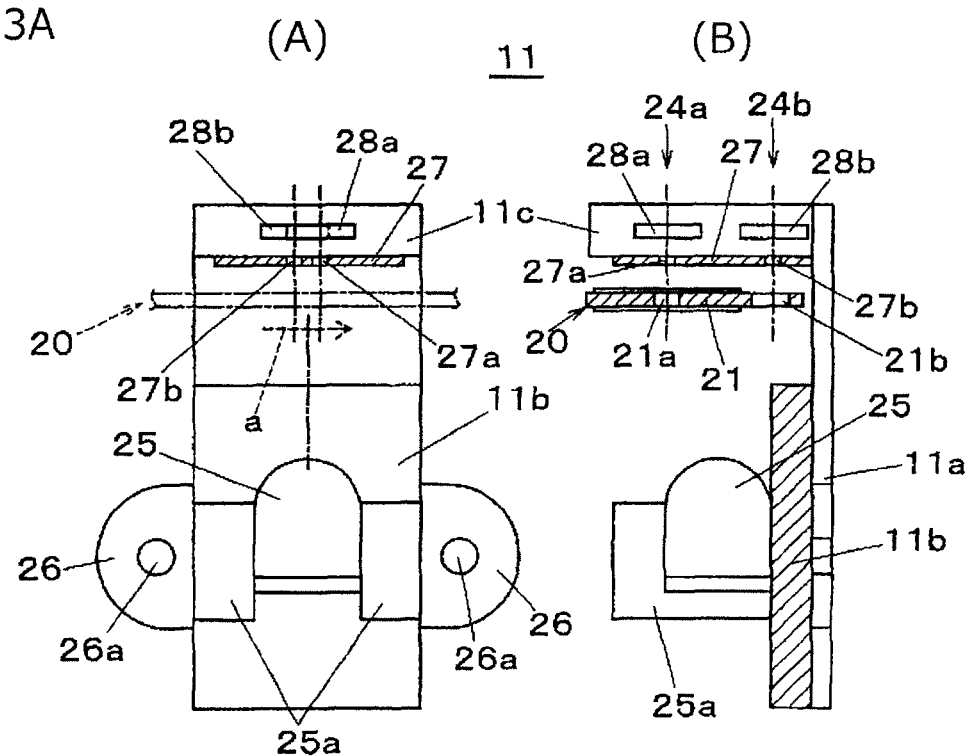
FIGS. 3A and 3B are explanatory diagrams for illustrating a configuration of a sensor unit used in the electronic component supply apparatus of the embodiment of the present invention.

Next, with reference to FIGS. 3A and 3B, a configuration and a function of the sensor unit 11 will be described. Sections (A) and (B) in FIG. 3A illustrate a side view and a sectional view of the sensor unit 11, respectively, in a tape transport direction (refer to an arrow a). As illustrated in FIG. 3A, the sensor unit 11 is configured to join a light-emitting section 11b and a sensor section 11c on the lower section and an upper section of a plate-shaped unit base 11a, respectively, which is disposed in a vertical orientation. Attachment portions 26 protrude from side surfaces of the unit base 11a and attachment holes 26a are provided in the attachment sections 26 such that the sensor unit 11 is fixed to the main body unit 1a through the attachment sections 26 by inserting fixing bolts (not illustrated) through the attachment holes 26a and fastening the bolts to the frame section of the main body unit 1a. In this manner, the sensor unit 11 is fixed to the main body unit 1a through the attachment sections 26. The component supply tape 20 as a detecting target is fed through between the top surface of the light-emitting section 11b and the undersurface of the sensor section 11c.

A light source 25 mounted to be fixed through a light-source mounting section 25a is disposed on the light-emitting section 11b, in an orientation in which a light-emitting direction is set toward the upper side. The sensor section 11c is irradiated with detecting light by turning on the light source 25. In the sensor section 11c, a component detecting sensor 28a and a sprocket hole detecting sensor 28b are disposed corresponding to positions of the accommodation section 21a and the sprocket hole 21b on the component supply tape 20 as the detecting target. Further, an aperture section 27 is mounted on the undersurface of the sensor section 11c and has a second hole 27a and a first hole 27b which are provided corresponding to positions of the component detecting sensor 28a and the sprocket hole detecting sensor 28b. As described above, since the cover tape 22 and the bottom tape 23 which adhere to the top and underside surfaces of the component supply tape 20 are optically transparent, inspection light radiating upward by turning on the light source 25 is transmitted through the accommodation section 21a and the sprocket hole 21b and is emitted to the upper side. Then, the inspection light is focused through the second hole 27a and the first hole 27b and is received at the component detecting sensor 28a and the sprocket hole detecting sensor 28b.

Figure 3B:
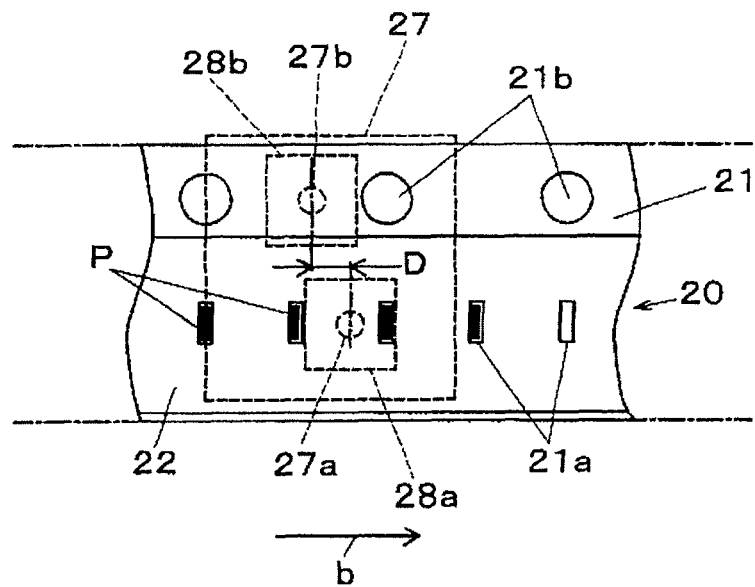

FIG. 3B illustrates a positional relationship between a position of the component detecting sensor 28a and the second hole 27a and a position of the sprocket hole detecting sensor 28b and the first hole 27b in the tape feeding direction. That is, the first hole 27b and the sprocket hole detecting sensor 28b positioned for detection of the sprocket hole 21b as the detecting target are disposed toward the upstream side (left side in FIG. 3B) by a predetermined offset dimension D in the tape feeding direction (an arrow b) from the component detecting sensor 28a and the second hole 27a positioned for detection of the presence or absence of the electronic component P as the detecting target in the accommodation section 21a.

Figure 4A:
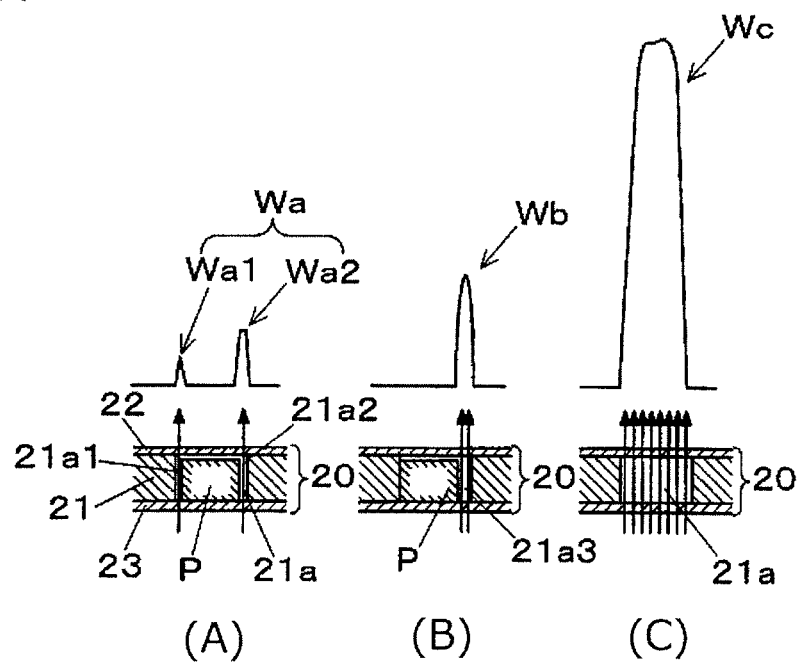
FIGS. 4A and 4B are explanatory diagrams illustrating output waveforms of the sensor unit used in the electronic component supply apparatus of the embodiment of the present invention.
Figure 4B:
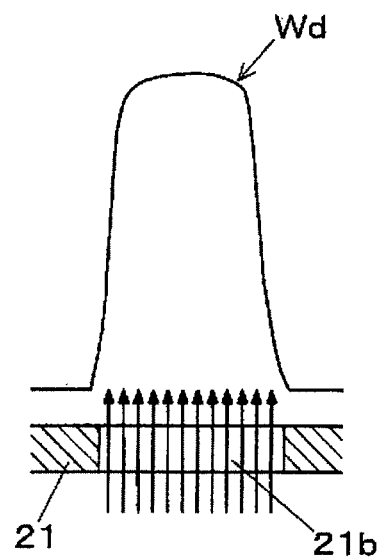

Here, with reference to FIGS. 4A and 4B, a description is provided about detection waveforms output by the component detecting sensor 28a and the sprocket hole detecting sensor 28b which receive the detection light radiating from the light source 25. FIGS. 4A and 4B illustrate the detection waveforms obtained when the accommodation section 21a and the sprocket hole 21b are the detecting targets, respectively. In FIGS. 4A and 4B, arrows depicted to penetrate through the component supply tape 20 represent inspection light which radiates from the light source 25 and transmits through the component supply tape 20.

First, sections (A) and (B) in FIG. 4A represent detection waveforms in a case where the electronic component P is present in the accommodation section 21a. The section (A) in FIG. 4A represents a detection waveform Wa in a case where there are gaps 21a1 and 21a2 on both sides of the electronic component P in the accommodation section 21a and inspection light transmits upward through the gaps 21a1 and 21a2 and is received by the component detecting sensor 28a. In this case, whenever the gaps 21a1 and 21a2 pass below the component detecting sensor 28a, the inspection light is received by the component detecting sensor 28a and two peaks Wa1 and Wa2 having sizes in accordance with a degree of the received light are acquired as the detection waveform Wa.

In addition, as illustrated in the section (B) in FIG. 4A, in a case where the electronic component P is positioned on one side in the accommodation section 21a and a gap 21a3 through which the inspection light is transmittable is present only on one side, the inspection light is received by the component detecting sensor 28a whenever the gap 21a3 passes below the component detecting sensor 28a and a detection waveform Wb formed of one peak having a size in accordance with a degree of the received light is acquired.

As illustrated in a section (C) in FIG. 4A, in a case where no electronic component P is positioned in the accommodation section 21a, the inspection light that has been transmitted through the entire range of the component detecting sensor 28a is received by the component detecting sensor 28a and one detection waveform Wc having a size in accordance with a light-receiving amount is acquired. The detection waveform Wc is characterized by a waveform width and a peak value greater than the detection waveforms Wa and Wb. Therefore, when the detection waveform corresponds to the detection waveforms Wa and Wb, the electronic component P is present in the accommodation section 21a and the detection waveform corresponds to the detection waveform Wc, the electronic component P is not present in the accommodation section 21a. Although omitted in the drawings, the detection waveform having almost no peak may be acquired in a case where the electronic component P is present. This case means that the size of the accommodation section 21a has small margin with respect to the size of the electronic component P and almost no gap through which the inspection light is transmittable is formed.

Further, FIG. 4B illustrates a detection waveform Wd acquired when the sprocket hole 21b passes the position of the sprocket hole detecting sensor 28b. In this case, since the light radiated from the light source 25 is received by the component detecting sensor 28a as the inspection light which has transmitted through the entire range of the sprocket hole 21b, the detection waveforms Wd having a great waveform width and peak value are acquired at intervals corresponding to a hole pitches of the sprocket holes 21b and a tape feeding speed. An evaluation parameter (a waveform width, a peak value, an integrated value, or the like) found from the acquired detection waveforms W is compared to a preset threshold value and thereby, it is possible to detect the presence or absence of the electronic component P in the accommodation section 21a as the detecting target and the passing of the sprocket hole 21b.

In the configuration described above, the light source 25, the second hole 27a, and the component detecting sensor 28a configure an electronic component detecting unit 24a that detects the electronic component P accommodated in the accommodation section 21a of the component supply tape 20, on the upstream side on the transport path 2 from the component picking-up position 14. Similarly, the light source 25, the first hole 27b, and the sprocket hole detecting sensor 28b configure a sprocket hole detecting unit 24b that detects the sprocket hole 21b of the component supply tape 20 on the upstream side on the transport path 2 from the component picking-up position 14. According to the present embodiment, the electronic component detecting unit 24a and the sprocket hole detecting unit 24b configure a single sensor unit 11.

Here, both the electronic component detecting unit 24a and the sprocket hole detecting unit 24b are configured of an optical sensor that includes the shared light source 25 as the light-emitting section, and the component detecting sensor 28a and the sprocket hole detecting sensor 28b as the light receiving section. That is, the sensor unit 11 is configured to have the light source 25 in which an LED is used as a single light source that emits light for detecting the sprocket hole and light for detecting the electronic component and to have the component detecting sensor 28a as the light receiving section for detecting the electronic component and the sprocket hole detecting sensor 28b as the light receiving section for detecting the sprocket hole. In this manner, it is possible to realize a compact sensor unit 11 having a simplified configuration, which has both functions of the sprocket hole detection and the electronic component detection.

Further, the optical sensor is configured to use the transmissive sensor; however, a reflective type sensor which receives reflected light of the light radiating from the light emitting section, which is reflected from a detection target, as the inspection light, may be used. Further, as the sensor used as the electronic component detecting unit 24a, a magnetic detection type sensor that reacts to a metal portion of the electronic component P and outputs a detection signal may be used instead of the optical sensor.

According to the present embodiment, as illustrated in FIG. 3B, the sprocket hole detecting unit 24b is disposed on the upstream side by the predetermined offset dimension D from the electronic component detecting unit 24a in the tape feeding direction. The employment of such a configuration makes it possible to first detect the sprocket hole 21b, normally, of a pair of accommodation section 21a and the sprocket hole 21b which are formed to be close to each other. The sprocket hole detection result is used as a reference and thereby, it is possible to reliably identify a detection signal corresponding to the subsequent accommodation section 21a and it is possible to perform efficient and highly reliable detection of the presence or absence of the electronic component P in the accommodation section 21a. The sensor unit 11 may be used as the tape detecting sensor that detects the presence or the passing of the component supply tape 20 on the transport path 2.

Figure 5:
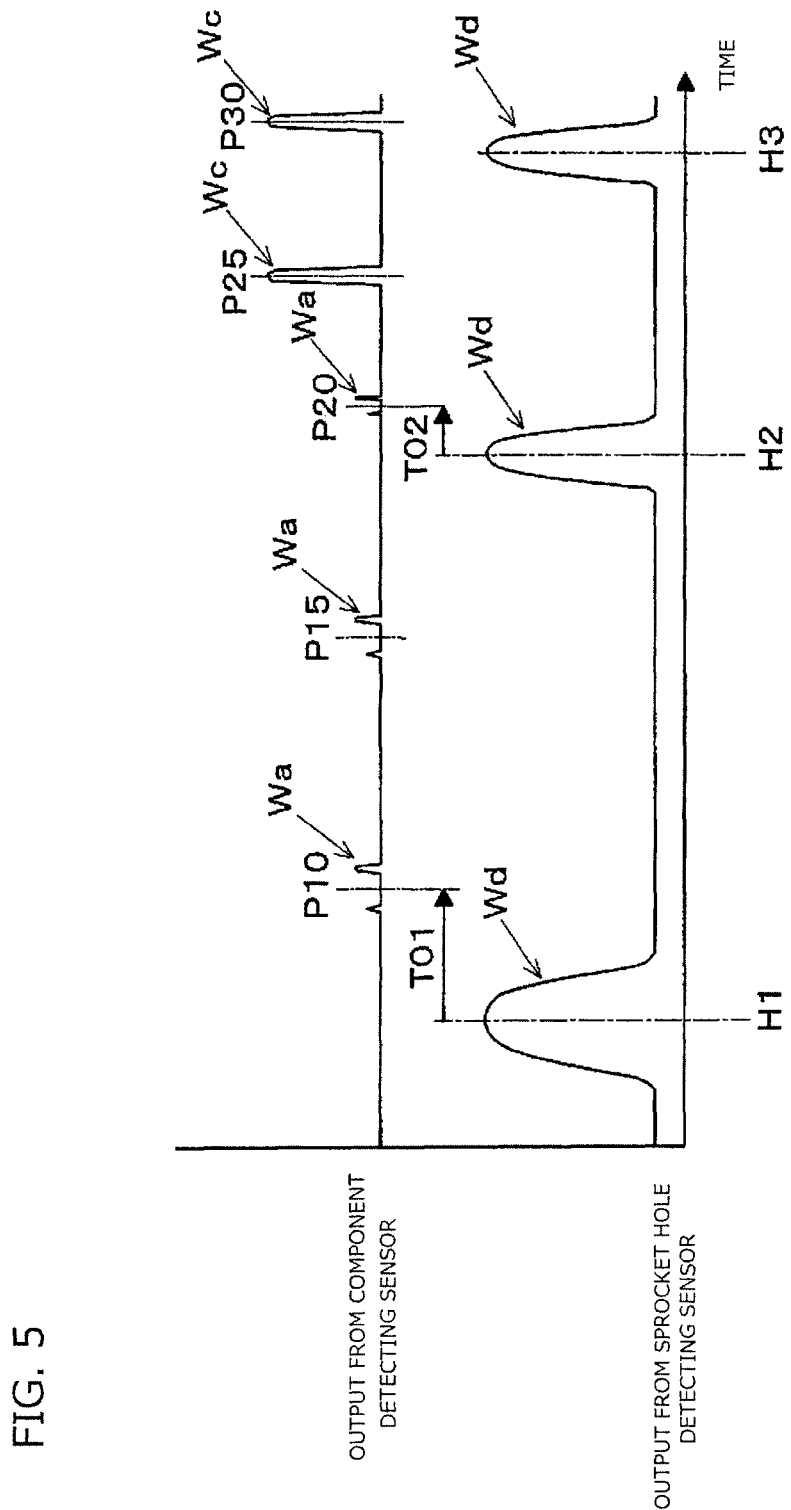
FIG. 5 is an explanatory diagram illustrating output forms of a component detecting sensor and a sprocket hole detecting sensor in the sensor unit used in the electronic component supply apparatus of the embodiment of the present invention.

Next, with reference to FIG. 5, a correlation between the detection signals of the component detecting sensor 28a and the sprocket hole detecting sensor 28b in the sensor unit 11 will be described. In FIG. 5, the output signals of the component detecting sensor 28a and the sprocket hole detecting sensor 28b are illustrated as waveforms using two of upper and lower graphs, in which the horizontal axis is shared as the time axis. In the lower graph corresponding to the output of the sprocket hole detecting sensor 28b, the timings H1, H2, and H3 arranged along the horizontal axis which indicates a time series representing timings at which the center of the sprocket hole 21b passes the sprocket hole detecting sensor 28b and the detection waveform Wd illustrated in FIG. 4B is acquired at each of the timings.

In the upper graph corresponding to the output of the component detecting sensor 28a, timings P10, P15, P20, P25, and P30 arranged along the horizontal axis which indicates a time series represent timings at which the center of the accommodation section 21a passes the component detecting sensor 28a and the detection waveform illustrated in FIG. 4A appears at each of the timings. As described above, the component detecting sensor 28a and the sprocket hole detecting sensor 28b have the positional relationship of being shifted by the predetermined offset dimension D from each other in the tape feeding direction. Hence, the detection waveform Wa of the accommodation section 21a adjacent to the sprocket hole 21b appears after a detection delay time T0 (T01 or T02) from the detection waveform Wd of the sprocket hole 21b.

Here, the sprocket holes 21b are formed at regular pitches in the component supply tape 20, however, practically, the component supply tape 20 does not always pass the sensor unit 11 in the tape feeder 1 at a regular speed, and variation is generated. In other words, since the component supply tape 20 is fed in a tape feeding method in which the component supply tape 20 is pushed from the upstream side to the downstream side even when the feeding motor 3M is driven at a regular speed, jamming is likely to occur, such as the component supply tape 20 deformed in an undulated manner on the transport path 2 or partially crumpled component supply tape 20.

When such jamming occurs, the component supply tape 20 does not pass the sensor unit 11 at the regular speed. FIG. 5 illustrates an example in which the passing the intermediate sensor 10 is performed at a low speed due to such jamming between the timings H1 and H2 and the passing is performed at a high speed between the timings H2 and H3 because such jamming is removed. In other words, even when the detection timing is determined in advance based on the driving by the feeding motor 3M, practically, the timing at which the accommodation section 21a passes the sensor unit 11 is highly likely to deviate from the predetermined detection timing such that it is possible that false detection is performed.

Thus, in the present embodiment, the timing at which the sprocket holes 21b formed in the component supply tape 20 at regular pitches pass the sensor unit 11 is detected, based on the timing, the detection waveform which is acquired when the accommodation section 21a passes is identified among the detection signals output from the component detecting sensor 28a, and the presence or absence of the electronic component P is determined based on the identified detection waveform.

According to the present embodiment, the sensor unit 11 described above detects the electronic component P in the accommodation section 21a, with the component supply tape 20, which has yet to pass the cover-tape processing unit 13 on the transport path 2, as the target. Therefore, posture stability in the accommodation section 21a is ensured for the electronic component P as the detecting target, due to the cover tape 22 such that it is possible to achieve high reliability of the component detection. Further, a component detecting process is performed on the upstream side of the cover-tape processing unit 13 such that it is possible to perform optical inspection without the influence of dust or the like which is produced when the cover tape 22 is peeled off or cut open.

Next, with reference to FIG. 7, a configuration and a processing function of the internal controller 15 in the tape feeder 1 will be described. The controller 15 is connected to the transport motor 7M that drives the transport sprocket mechanism 7 and to the feeding motor 3M that drives the feeding sprocket 3 and controls the driving of the motors 7M and 3M. In addition, the controller 15 is connected to the component detecting sensor 28a, the sprocket hole detecting sensor 28b, the following-tape detecting sensor 8, the intermediate sensor 10, and the feeding sprocket sensor 3a which configure the sensor unit 11, and receives the detection signals from the sensors. Further, the controller 15 is connected to a state displaying section 16a and an operation switch group 16b which are provided on the operation/display panel 16 (refer to FIG. 1) such that the controller 15 controls a display process performed by the state displaying section 16a, receives an operation signal input through the operation switch group 16b, and transmits and receives a signal to and from the component mounting apparatus through a communication unit 40 which corresponds to a communication interface.

The processing function of the controller 15 will be described. The controller 15 internally includes a sensing information storage unit 30, a component presence/absence determining unit 31, a component depletion determining unit 32, a following-tape transport processing unit 33, a following-tape transfer processing unit 34, a slippage detection processing unit 35, a heading-of-component processing unit 36, a preceding-tape transport processing unit 37, a preceding-tape discharge processing unit 38, and a component presence/absence information storage unit 39.

The sensing information storage unit 30 stores sensing information detected by the component detecting sensor 28a, the sprocket hole detecting sensor 28b, the following-tape detecting sensor 8, the intermediate sensor 10, and the feeding sprocket sensor 3a. The controller 15 performs control processes of the units based on the sensing information stored in the sensing information storage unit 30.

The component presence/absence determining unit 31 determines the presence or absence of the electronic component P in the accommodation section 21a based on information from the sprocket hole detecting unit 24b and information from the electronic component detecting unit 24a. In other words, the component presence/absence determining unit 31 identifies the information obtained from the electronic component detecting unit 24a when the accommodation section 21a passes the electronic component detecting unit 24a, based on the information from the sprocket hole detecting unit 24b and determines the presence or absence of the electronic component P in the accommodation section 21a which has passed the electronic component detecting unit, based on the identified information.

In this manner, the information obtained when the accommodation section 21a passes the electronic component detecting unit 24a is identified based on the information from the sprocket hole detecting unit 24b and thereby, it is possible to perform the component detection with high accuracy without the influence of variation of the passing speed of the component supply tape 20 on the transport path 2. Hence, in the tape feeder 1 according to the present embodiment, the controller 15 controls the above-described component supply tape transport unit (the feeding sprocket 3 and the transport sprocket mechanism 7) based on the determination result of the component presence/absence determining unit 31.

The component depletion determining unit 32 determines component depletion in the preceding tape 20 (1) based on the determination result of the component presence/absence determining unit 31. In other words, when the determination result of the component presence/absence determining unit 31 indicates "absence" in one accommodation section 21a or "absence" consecutively a plurality of times, depletion of the electronic components P in the preceding tape 20 (1) is determined. Based on the determination of the component depletion, the accommodation section 21a of the preceding tape 20 (1), in which the final component Pe (refer to FIG. 8) is accommodated, is identified and a preceding-tape discharge instruction or a preceding-tape replacement instruction is output at a timing at which the final component Pe reaches the component picking-up position 14.

The following-tape transport processing unit 33 performs a process of causing the feeding sprocket 3 which corresponds to the inserted tape feeding unit to transport the following tape 20 (2) inserted through the insertion port 2a. In other words, the following-tape transport processing unit 33 performs the process in which the leading end portion 20s of the following tape 20 (2) is fed to the following-tape stopper 9 which means a standby position, the following tape 20 (2) is temporarily stopped, and the following tape 20 (2) is transported to a delivery position to the first sprocket 5 of the transport sprocket mechanism 7 after the preceding tape 20 (1) is discharged.

The following-tape transfer processing unit 34 performs a process of delivering the leading end portion 20s of the following tape 20 (2) transported through the process of the following-tape transport processing unit 33 after the depleted preceding tape 20 (1) is discharged by the transport sprocket mechanism 7. In other words, the following-tape transfer processing unit 34 corresponding to a subsequent-tape delivery unit that causes the feeding sprocket 3 to transport the following tape 20 (2) which is the subsequent component supply tape 20 on the transport path 2 and that delivers a leading end portion 20s of the following tape 20 (2) to the transport sprocket mechanism 7, after the transport sprocket mechanism 7 transports the depleted preceding tape 20 (1).

The slippage detection processing unit 35 performs a process of detecting "slippage" occurring when the transport sprocket mechanism 7 transports the following tape 20 (2). In other words, the slippage detection processing unit 35 detects "slippage" which means tape feeding slippage occurring when the following tape 20 (2) which is fed by pitch by the feeding sprocket 3 is delivered to the transport sprocket mechanism 7. Here, "slippage" means abnormal tape feeding due to the rotation of the first sprocket 5 in a state in which feeding claws do not normally engage with the sprocket holes 21b in a tape feeding method in which the first sprocket 5 is caused to rotate in a state in which the feeding claws of the first sprocket 5 engage with the sprocket holes 21b formed in the base tape 21 at regular pitches.

Due to the "slippage", a difference is generated between a tape feeding amount in data, obtained through a rotation amount of the first sprocket 5 and a tape feeding amount by which the following tape 20 (2) is actually transported. As a result, when the following tape 20 (2) is fed to the component picking-up position 14 and the leading component Ps is positioned at the component picking-up position 14, a tape feeding error occurs by the amount of "slippage".

According to the present embodiment, the heading-of-component processing unit 36 to be described below corrects such a tape feeding error. In other words, the heading-of-component processing unit 36 corrects the transport of the following tape 20 (2) by the transport sprocket mechanism 7 based on the slippage detected by the slippage detection processing unit 35 and thereby, a heading-of-component process of positioning the leading component Ps in the following tape 20 (2) at the component picking-up position 14 is performed.

The preceding-tape transport processing unit 37 performs a process of transporting the electronic components P accommodated in the accommodation section 21a to the component picking-up position 14, in order, by transporting the preceding tape 20 (1) by pitch, based on the instruction from the component mounting apparatus. The preceding-tape discharge processing unit 38 performs a process of discharging an empty tape part of the preceding tape 20 (1) through the discharge port 2b after the final component Pe of the preceding tape 20 (1) reaches the component picking-up position 14. In other words, the preceding-tape discharge processing unit 38 which corresponds to a tape discharge processing unit drives the transport sprocket mechanism 7 until feeding amounts of the component supply tape 20 by the transport sprocket mechanism 7 are accumulated to become a predetermined feeding amount after the passing of the terminal end portion 20e of the component supply tape 20 is detected by the tape detecting sensor such as the intermediate sensor 10 on the transport path 2.

The component presence/absence information storage unit 39 stores the presence or absence of a component in the accommodation sections 21a of the component supply tape 20, which is detected by the component presence/absence determining unit 31, that is, the accommodation sections 21a present between the sensor unit 11 and the component picking-up position 14, for each accommodation section 21a. In the preceding-tape transport process by the preceding-tape transport processing unit 37, how many pitch feeding times the preceding tape 20 (1) is fed are controlled based on the component presence/absence information on each accommodation section 21a, which is stored in the component presence/absence information storage unit 39.

Figure 6:
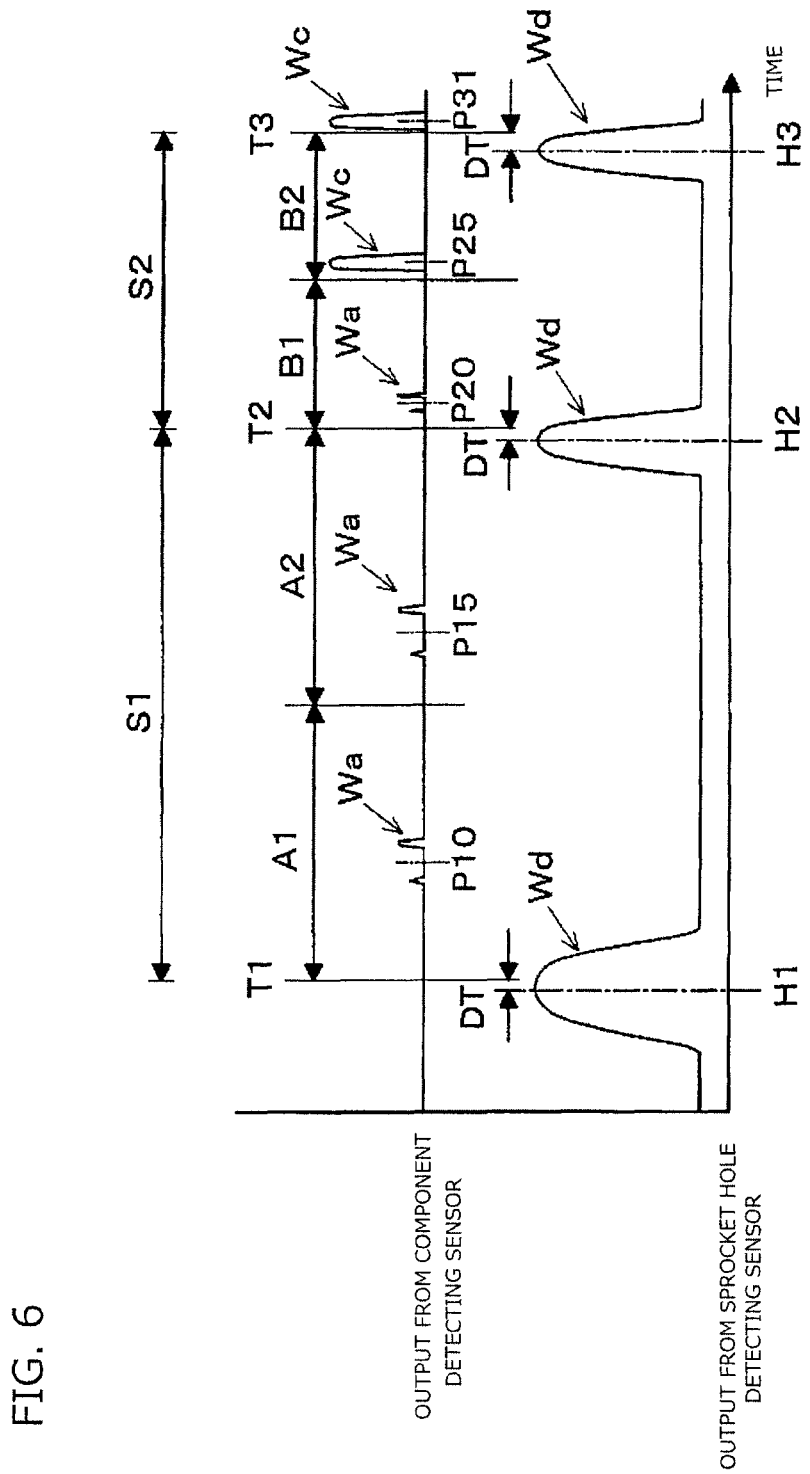
FIG. 6 is an explanatory diagram illustrating component presence/absence detection by the sensor unit used in the electronic component supply apparatus of the embodiment of the present invention.

Next, a component presence/absence determining process will be described with reference to FIG. 6. The component presence/absence determination is performed using a process function of the component presence/absence determining unit 31 (refer to FIG. 7) which is included in the controller 15. The component presence/absence determining unit 31 identifies a range of the detection waveform corresponding to the accommodation section 21a of the output information on the component detecting sensor 28a which is stored in the sensing information storage unit 30. Specifically, the timings H1 and H2 are detected using the output of the sprocket hole detecting sensor 28b and timings T1 and T2 obtained by a delay of standard delay time DT from the timings H1 and H2 are determined. According to the present example, since the accommodation sections 21a are provided at a pitch which is half the pitch of the sprocket hole 21b, the component presence/absence determining unit 31 equally divides a zone between the timings T1 to T2 (first cycle) into two zones of a first zone A1 and a second zone A2 with a time reference. The first zone A1 and the second zone A2 correspond to the accommodation sections 21a, one to one, and contain a continuous detection waveform (hereinafter, referred to as a continuous waveform) obtained between time points of immediately before the accommodation sections 21a corresponding to the zones A1 and A2 pass the component detecting sensor 28a and immediately after the passing.

Next, the component presence/absence determining unit 31 evaluates the output of the component detecting sensor 28a in the respective first zone A1 and the second zone A2 and the presence or absence of a component in the accommodation section 21a which has passed the component detecting sensor 28a is determined by determining whether the output corresponds to the detection waveform Wc. The determination is performed in a method in which an evaluation parameter such as a mean value, an integrated value, or the like, of the detection waveform, is compared to a preset threshold value based on a component presence/absence pattern illustrated in FIG. 4A, or the like. In this manner, the component presence/absence determining unit 31 identifies output information (detection waveform) obtained from the component detecting sensor 28a, based on the information from the sprocket hole detecting sensor 28b, when the accommodation section 21a passes the component detecting sensor 28a and the presence or absence of the electronic component in the passing accommodation section, based on the identified output information.

The component presence/absence determining unit 31 also executes the same process in a cycle from a second cycle S2 when the component presence/absence determining process is ended in a first cycle S1. The standard delay time DT used when the timings T1 and T2 are determined in the component presence/absence determining process is used to adjust the timings T1 and T2 such that the timings T1 and T2 are not overlapped in the continuous waveform and the standard delay time DT does not have to be necessarily used. For example, in a case where the offset dimension D is set such that the component detecting sensor 28a does not detect the accommodation section 21a but detects a portion of the component supply tape 20 when the sprocket hole detecting sensor 28b detects the passing of the sprocket hole, the component presence/absence determining process may be performed with the timings H1 and H2 as the timings T1 and T2 without any delay.

Next, with reference to FIG. 8 and FIG. 9, the tape feeding operation of the component supply tape 20 in the tape feeder 1 will be described. Here, an electronic component supply method in which the component supply tape 20 illustrated in FIGS. 2A and 2B is inserted through the insertion port 2a of the transport path 2 and transported to the component picking-up position 14 along the transport path 2 and the electronic component P accommodated in the accommodation section 21a is supplied to the component mounting apparatus is illustrated and a processing method of the component supply tape 20 in the tape feeder 1 is illustrated.

Figure 8:
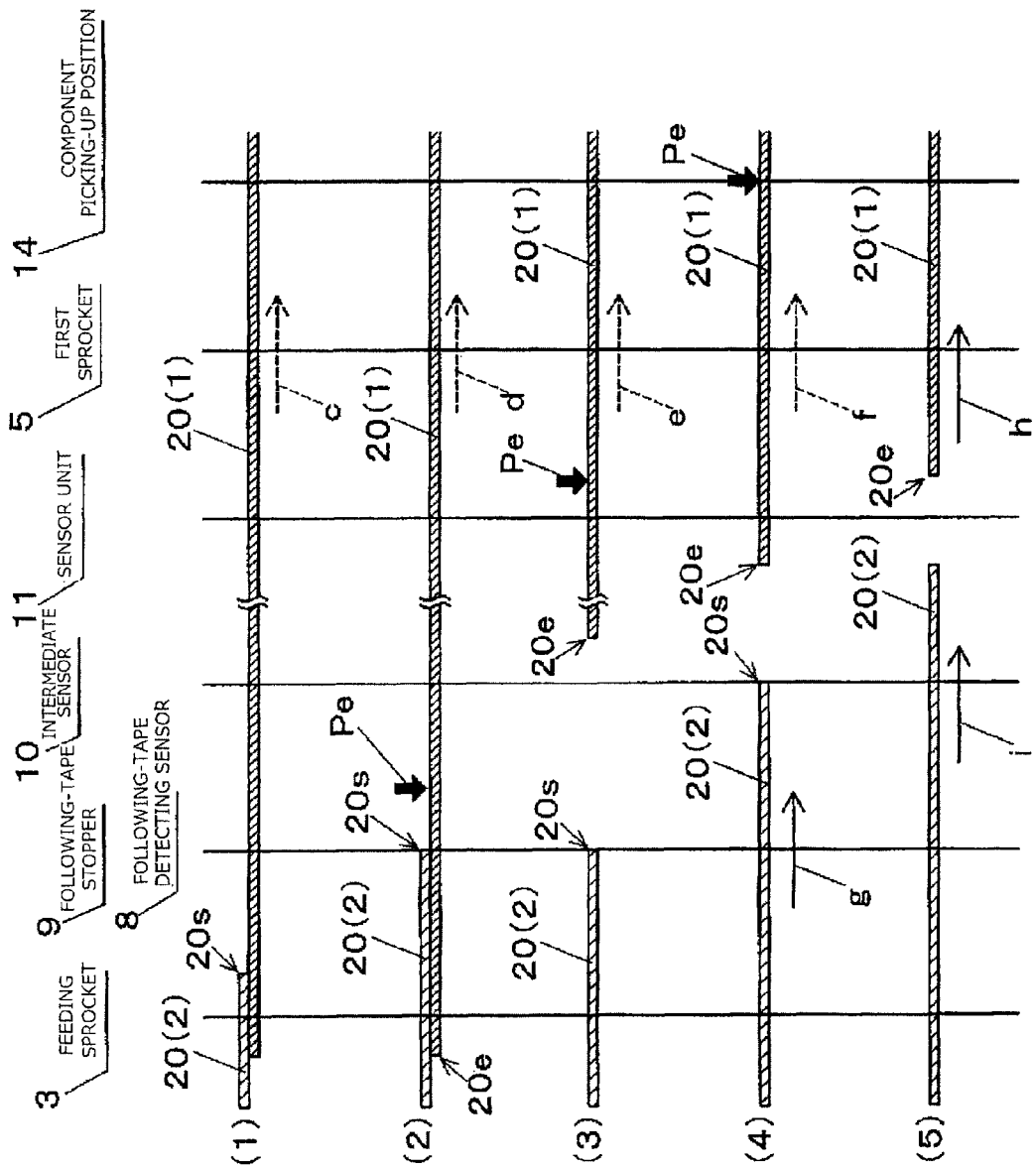
FIG. 8 is an explanatory diagram illustrating a tape transport operation in the electronic component supply apparatus of the embodiment of the present invention.
Figure 9:
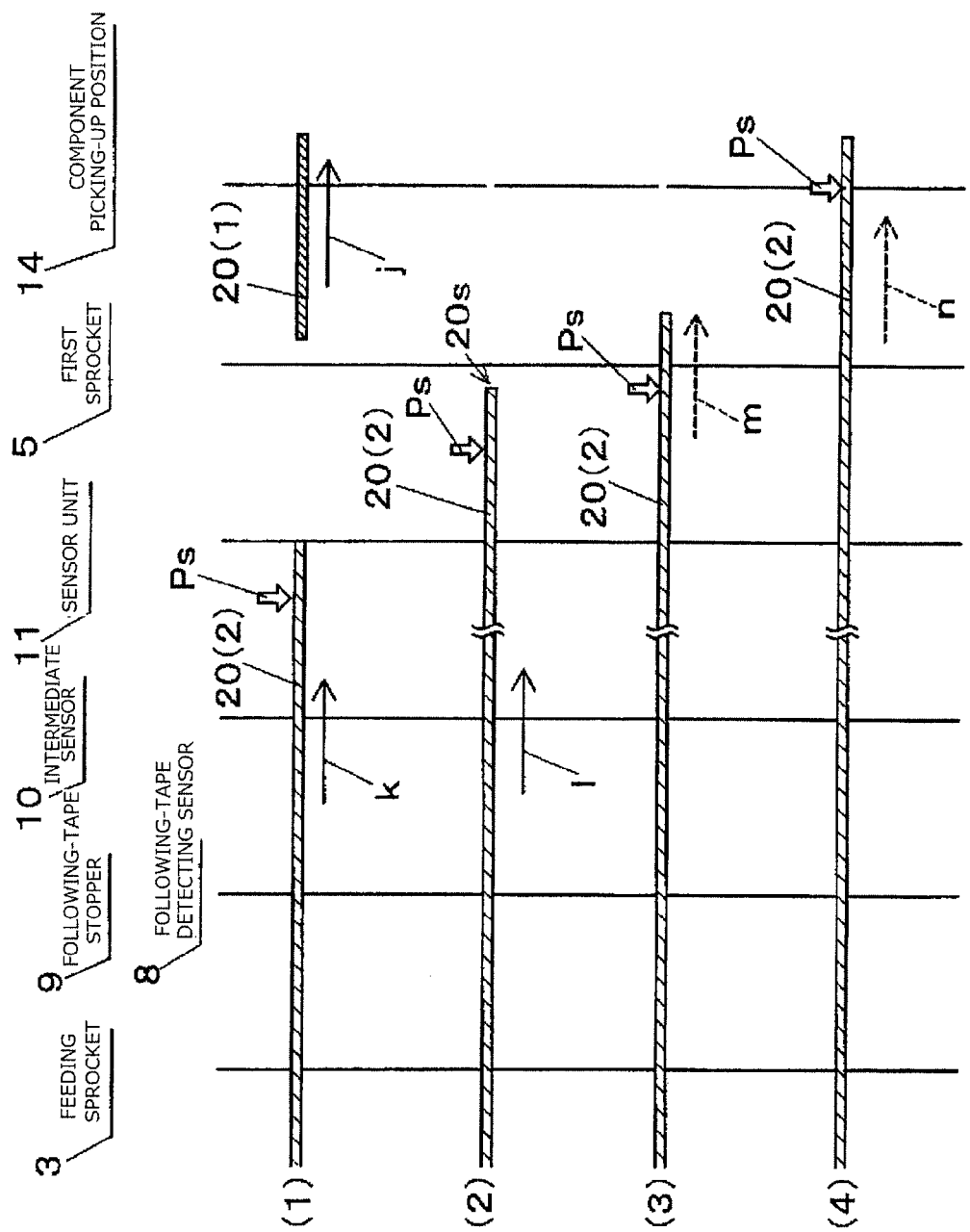
FIG. 9 is an explanatory diagram illustrating the tape transport operation in the electronic component supply apparatus of the embodiment of the present invention.

(1) to (5) in FIG. 8 and (1) to (4) in FIG. 9 schematically illustrate a simplified series of tape feeding operations of the preceding tape 20 (1) and the following tape 20 (2) which is additionally refilled to be subsequent to the preceding tape 20 (1) in the same tape feeder 1. The preceding tape 20 (1) and the following tape 20 (2) are discharged from the discharge port 2b passing, from the upstream side, the feeding sprocket 3, the following-tape stopper 9 and the following-tape detecting sensor 8, the intermediate sensor 10, the sensor unit 11, the first sprocket 5, and the component picking-up position 14, in this order. In such tape feeding, arrows by solid lines indicate a continuous feeding transport operation in which the tape feeding of the component supply tape 20 is continuously performed and arrows by dotted lines indicate a pitch feeding transport operation in which the tape feeding of the component supply tape 20 is intermittently performed.

(1) in FIG. 8 illustrates a state in which an operator inserts the following tape 20 (2) through the insertion port 2a based on a component refilling instruction in a state in which the component supply is continued by the pitch feeding (an arrow c) of the preceding tape 20 (1) in the tape feeder 1. Here, the leading end portion 20s of the following tape 20 (2) is inserted to the downstream side passing the feeding sprocket 3. In this manner, the feeding sprocket 3 rotates, the driving of the feeding motor 3M is started by detecting of the rotation by the feeding sprocket sensor 3a, and the transport of the following tape 20 (2) is performed.

As illustrated in (2) in FIG. 8, the leading end portion 20s of the following tape 20 (2) reaches the following-tape stopper 9 and the following-tape detecting sensor 8 detects the following tape 20 (2) and thereby, the driving of the feeding motor 3M is stopped and the following tape 20 (2) is stopped. Then, the following tape 20 (2) waits at the position when the terminal end portion 20e of the preceding tape 20 (1) which is repetitively fed by pitch (an arrow d) passes the intermediate sensor 10. The operation illustrated in (1) and (2) in FIG. 8 described above corresponds to a following-tape preparing step in which the subsequently refilled following tape 20 (2) is prepared in a pitch feeding process of the preceding tape 20 (1).

Figure 7:
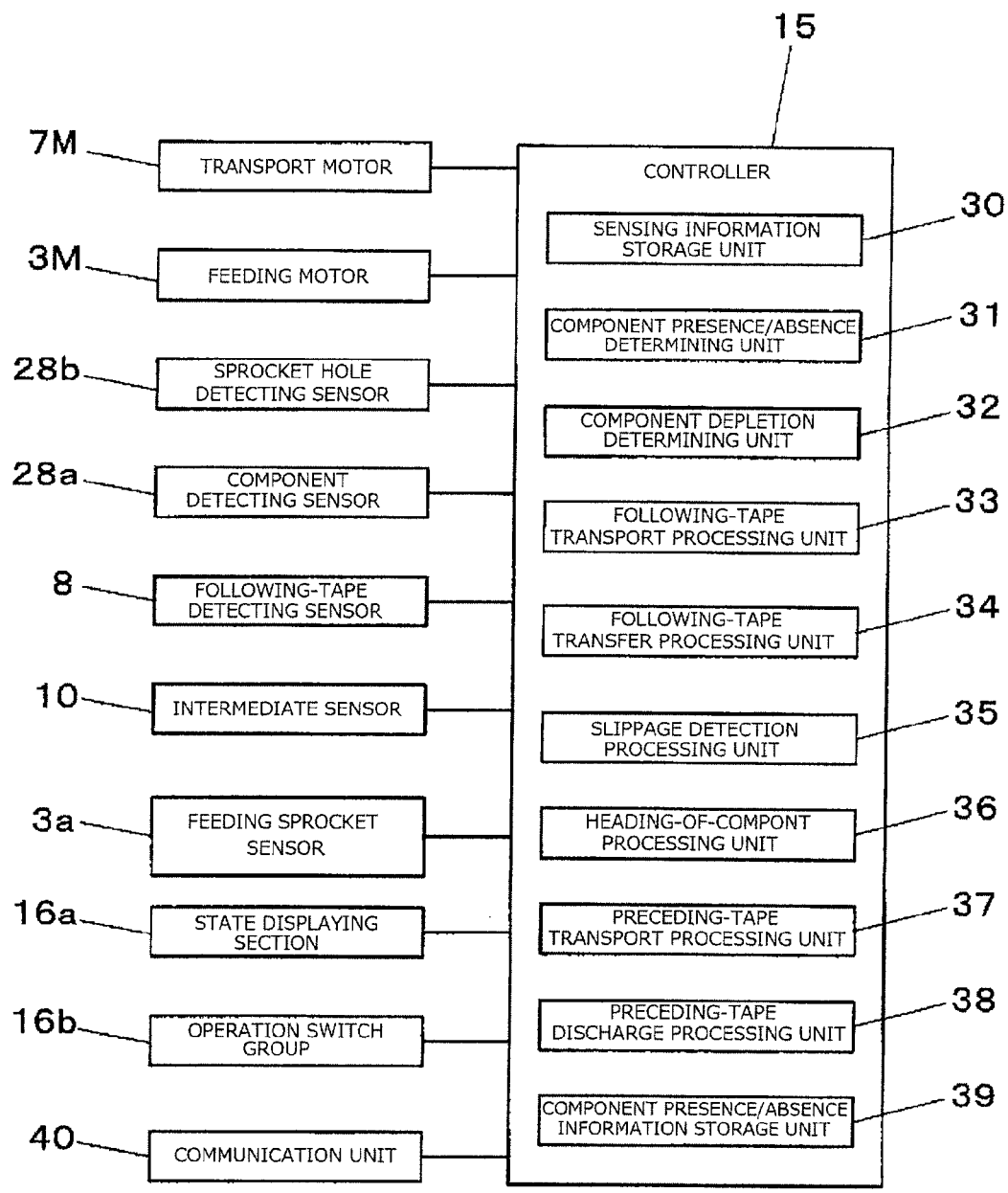
FIG. 7 is a block diagram illustrating a control processing function of the electronic component supply apparatus of the embodiment of the present invention.

The following-tape preparing step is executed by controlling the respective units by the following-tape transport processing unit 33 (refer to FIG. 7). In other words, after the intermediate sensor 10 which is the tape detecting sensor detects the passing of the terminal end portion 20e of the preceding component supply tape 20 (preceding tape 20 (1)), the following-tape transport processing unit 33 functions as a subsequent-tape transport unit that causes the feeding sprocket 3 to transport the following tape 20 (2) which is the subsequent component supply tape 20 to a position which is detected by the intermediate sensor 10, on the transport path 2.

Then, as illustrated in (3) and (4) in FIG. 8, the preceding tape 20 (1) is further fed (arrows e and f) by pitch. In other words, the transport motor 7M feeds the preceding tape 20 (1) by pitch and transports the electronic components P accommodated in the accommodation sections 21a to the component picking-up position 14 in order, based on the instruction from the component mounting apparatus. After the intermediate sensor 10 as the tape detecting sensor detects the passing of the terminal end portion 20e of the preceding tape 20 (1), as illustrated in (4) in FIG. 8, the feeding sprocket 3 which corresponds to the inserted tape feeding unit continuously feeds and transports (an arrow g) to a position at which the intermediate sensor 10 can detect the subsequent tape 20 (2) on the transport path 2. When the intermediate sensor 10 detects the following tape 20 (2), the feeding motor 3M is stopped and the following tape 20 (2) waits at the position.

In the pitch feeding of the preceding tape 20 (1) illustrated in (2) and (3) in FIG. 8, the component presence/absence determining unit 31 performs the presence or absence determination of the electronic component P in the accommodation section 21a passing the sensor unit 11, using the output from the sensor unit 11. The component presence/absence determination result is stored as the component presence/absence information in association with the respective accommodation sections 21a in the component presence/absence information storage unit 39. The component depletion determination, the heading-of-component process, and the tape discharge process to be described below are executed based on the component presence/absence information stored in the component presence/absence information storage unit 39.

In a case where the component presence/absence determining unit 31 determines "absence" with respect to one accommodation section 21a, or "absence" consecutively, the controller 15 determines that the final component Pe is accommodated in the accommodation section 21a which is determined as "presence" at the last time and calculates the pitch feeding times (final component pitch feeding times) which are needed until the final component Pe reaches the component picking-up position 14. Hence, when the tape feeding of the preceding tape 20 (1) is performed, subtraction of the final component pitch feeding times is performed whenever the pitch feeding is performed.

(4) in FIG. 8 illustrates a state in which the final component pitch feeding times becomes zero and the final component Pe reaches the component picking-up position 14 in the tape feeding of the preceding tape 20 (1). In this state, the controller 15 notifies the component mounting apparatus of an indication thereof. The component mounting apparatus that receives the notification outputs the preceding-tape discharge instruction or the preceding-tape replacement instruction to the tape feeder 1 after the mounting head picks up the final component Pe at the component picking-up position 14.

The operation illustrated in (3) and (4) in FIG. 8 corresponds to a preceding-tape pitch feeding step in which the preceding tape 20 (1) is fed by pitch, the sensor unit 11 performs the component presence/absence detection, and the pitch feeding is repetitively executed until the final component Pe reaches the component picking-up position 14. Then, the preceding-tape pitch feeding step is executed by controlling the respective units by the preceding-tape transport processing unit 37 (refer to FIG. 7) of the controller 15.

In other words, when the determination result of the component presence/absence determining unit 31 is "absence" or "absence" a plurality of consecutive times, the controller 15 determines that the electronic components P are depleted in the preceding tape 20 (1) and notifies the component mounting apparatus of the indication thereof. After the final component Pe is picked up at the component picking-up position 14, the controller 15 causes the transport sprocket mechanism 7 which corresponds to the component supply tape transport unit to transport the depleted preceding tape 20 (1) to the discharge port 2b.

In addition, when the determination result of the component presence/absence determining unit 31 is first "presence" after the leading end portion 20s of the following tape 20 (2) passes the electronic component detecting unit 24a, the controller 15 determines that the leading component Ps which is the leading electronic component P of the following tape 20 (2) is detected and causes the transport sprocket mechanism 7 which corresponds to the component supply tape transport unit to transport the following tape 20 (2) such that the leading component Ps is positioned at the component picking-up position 14.

When the preceding-tape discharge instruction or the preceding-tape replacement instruction is output, the preceding-tape discharge processing unit 38 controls the respective units and thereby a preceding-tape discharge process to be described below is executed such that the depleted preceding tape 20 (1) is discharged after the final component Pe is picked up. Here, in a stage in which the final component Pe reaches the component picking-up position 14, there are two cases depending on whether or not the intermediate sensor 10 disposed on the transport path 2 already detects the passing of the terminal end portion 20e of the preceding tape 20 (1).

First, in the case (case 1) where the passing of the terminal end portion 20e is already detected, a tape feeding amount (driving time of the transport motor 7M, an encoder pulse amount, pitch feeding times, or the like) required for the preceding tape 20 (1) to be transported from the intermediate sensor 10 to the discharge port 2b is already found out. Thus, the preceding-tape discharge processing unit 38 calculates a remaining tape feeding amount required for the preceding tape 20 (1) to be discharged using the timing at which the preceding tape 20 (1) passes the intermediate sensor 10 and the tape feeding amount required for the final component Pe to reach the component picking-up position 14 from the timing, and the preceding-tape discharge processing unit 38 drives the transport motor 7M by the tape feeding amount. In this manner, after the final component Pe is picked up, the depleted preceding tape 20 (1) is discharged (an arrow h) from the discharge port 2b through the continuous feeding transport.

Meanwhile, in a stage in which the final component Pe reaches the component picking-up position 14 and in the case (case 2) in which the passing of the terminal end portion 20e has yet to be detected, the transport motor 7M is driven as is and the discharge of the preceding tape 20 (1) is started. In the process of the tape feeding operation for the discharge, when the intermediate sensor 10 detects the passing of the terminal end portion 20e, the transport motor 7M is driven by an amount required for the tape feeding of the preceding tape 20 (1) from the position of the intermediate sensor 10 to the discharge port 2b. In this manner, after the final component Pe is picked up, the depleted preceding tape 20 (1) is discharged from the discharge port 2b through the continuous feeding transport.

After the final component Pe (last component) is picked up at the component picking-up position 14 after the component depletion determining unit 32 determines depletion, the preceding-tape discharge processing unit 38 functions as a tape discharge processing unit that transports the depleted preceding tape 20 (1) in the component supply tape transport unit to the discharge port 2b through the continuous feeding transport.

In addition, when the terminal end portion 20e of the preceding tape 20 (1) passes the intermediate sensor 10, the feeding motor 3M is driven and the transport of the following tape 20 (2) is started. As illustrated in (4) in FIG. 8, when the intermediate sensor 10 detects the leading end portion 20s of the following tape 20 (2), the feeding motor 3M is stopped and the following tape 20 (2) waits at the position. Next, as illustrated in (5) in FIG. 8 and (1) in FIG. 9, the terminal end portion 20e of the preceding tape 20 (1) passes the sensor unit 11, the feeding motor 3M is driven and the transport (an arrow i) of the following tape 20 (2) is started through the continuous feeding. When the sensor unit 11 detects the leading end portion 20s of the following tape 20 (2), the feeding motor 3M is stopped. At this timing, the detection of the leading component Ps passing the sensor unit 11 is started.

When the discharge (an arrow j) of the preceding tape 20 (1) is completed in (1) in FIG. 9, the following tape 20 (2) is transported (an arrow k) through the continuous feeding and a following-tape transfer process of causing the following tape 20 (2) to engage with the first sprocket 5 of the transport sprocket mechanism 7 and of transferring the following tape 20 (2) is started. First, the feeding motor 3M is driven and the following tape 20 (2) is transported (an arrow 1) through the continuous feeding until the leading end portion 20s approaches the vicinity of the first sprocket 5 as illustrated in (2) in FIG. 9.

Next, when the leading end portion 20s approaches the vicinity of the first sprocket 5, the tape feeding operation of the feeding motor 3M is changed to the pitch feeding (an arrow m) and the tape feeding operation of the transport motor 7M that drives the first sprocket 5 is also changed to the pitch feeding as illustrated in (3) in FIG. 9. At that time, both counting of pitch transport times K1 of the transport motor 7M and counting of the number K2 of the sprocket holes 21b which have passed the sprocket hole detecting sensor 28b are started. The pitch transport of the feeding motor 3M is stopped at a timing at which it is considered that the leading end portion 20s of the following tape 20 (2) passes the first sprocket 5 and then, only the transport motor 7M is driven and performs the tape transport (an arrow n) through the pitch feeding of the following tape 20 (2).

The leading end portion 20s of the following tape 20 (2) passes the component picking-up position 14, the leading component Ps reaches the component picking-up position 14 as illustrated in (4) in FIG. 9 and thereby, the heading of component of the following tape 20 (2) is completed. Then, the leading component Ps is picked up by the mounting head of the component mounting apparatus and then, the picking-up of the component from the following tape 20 (2) as a target is started.

In the tape feeder 1 according to the present embodiment as described above, when the component supply tape 20 having the plurality of accommodation sections 21a and the sprocket holes 21b formed at regular intervals is transported to the component picking-up position 14 and the electronic components P accommodated in the accommodation sections 21a are supplied to the component mounting apparatus, the sprocket hole detecting unit 24b and the electronic component detecting unit 24a detect the sprocket hole 21b and the electronic component P, respectively, on the upstream side on the transport path 2 from the component picking-up position 14 and the component presence/absence determining unit 31 determines the presence or absence of the electronic component P in the accommodation section 21a based on the information from the sprocket hole detecting unit 24b and the information from the electronic component detecting unit 24a.

In this manner, it is possible to perform efficient and accurate detection of the presence or absence of the electronic component P in the accommodation section 21a of the component supply tape 20. The feeding sprocket 3 and the transport sprocket mechanism 7 which are the component supply tape transport unit are controlled based on the determination result of the component presence/absence determining unit 31 and thereby, it is possible to perform the positioning of the leading component Ps of the component supply tape 20 and the discharge of the empty tape after the final component Pe is picked up is discharged, without wasting time and it is possible to improve the productivity.

An electronic component supply apparatus of the embodiments is effective in that it is possible to position the leading component of a component supply tape and to discharge an empty tape from which the final component has been picked up without wasting time to improve productivity and is applicable in a component mounting field in which an electronic component is mounted on a substrate.

What is claimed is:

1. An electronic component supply apparatus that transports a component supply tape which has a plurality of accommodation sections and which accommodates electronic components in the accommodation sections and is covered with a cover tape and sprocket holes formed at regular intervals, to a component picking-up position and that supplies each of the electronic components accommodated in each of the accommodation sections to a component mounting apparatus, the electronic component supply apparatus comprising:

a main body unit which is provided with a transport path that guides the component supply tape from an insertion port, through which the component supply tape is inserted, to a discharge port, through which the component supply tape is discharged;

a component supply tape transport unit that transports the component supply tape inserted through the insertion port toward the discharge port and that positions the accommodation section at the component picking-up position on an upstream side from the discharge port;

a cover-tape processing unit that peels off or cuts open the cover tape of the component supply tape which has yet to reach the component picking-up position and that exposes the electronic component accommodated in the accommodation section;

an electronic component detecting unit that detects the electronic component accommodated in the accommodation section of the component supply tape which has yet to pass the cover tape processing unit on the transport path;

a sprocket hole detecting unit that directly detects the sprocket holes of the component supply tape which has yet to pass the cover tape processing unit on the transport path;

a tape end detecting unit that detects a passing of a terminal end portion of the component supply tape;

a determination unit that determines presence or absence of an electronic component in the accommodation section based on information from the electronic component detecting unit; and a control unit that controls the component supply tape transport unit based on a determination result of the determination unit wherein the control unit determines that the electronic components are depleted in the component supply tape based on a determination result of the determination unit; and wherein the control unit calculates a remaining tape feeding amount required for the component supply tape to be discharged based on a detecting result of the tape end detecting unit, and the control unit causes the component supply tape transport unit to transport the component supply tape depleted of electronic components to the discharge port by the remaining tape feeding amount after a final electronic component of the component supply tape is picked up at the component picking-up position.

2. The electronic component supply apparatus according to claim 1,
wherein the control unit determines that the electronic components are depleted in the component supply tape when the determination result of the determination unit is "absence" or determination results of the determination unit are "absence" a plurality of consecutive times, notifies the component mounting apparatus of an indication thereof, and causes the component supply tape transport unit to transport the depleted component supply tape to the discharge port after a final component is picked up at the component picking-up position.

3. The electronic component supply apparatus according to claim 1,
wherein the control unit determines that a leading electronic component is detected when a determination result of the determination unit is first "presence" after a leading end of the component supply tape passes the electronic component detecting unit and causes the component supply tape transport unit to transport the component supply tape so that the leading electronic component is positioned at the component picking-up position.

4. The electronic component supply apparatus according to claim 1,
wherein the electronic component detecting unit is an optical sensor.

5. The electronic component supply apparatus according to claim 1,
wherein the electronic component detecting unit is a magnetic sensor.

6. The electronic component supply apparatus according to claim 1,
wherein the sprocket hole detecting unit is disposed on the upstream side from the electronic component detecting unit.

7. The electronic component supply apparatus according to claim 1,
wherein the sprocket hole detecting unit and the electronic component detecting unit are configured to have an optical sensor that includes a light-emitting section and a light-receiving section, and the light-emitting section emits a light toward a position of the sprocket hole.

8. The electronic component supply apparatus according to claim 1,
wherein the sprocket hole detecting unit and the electronic component detecting unit are a single sensor unit.

9. The electronic component supply apparatus according to claim 1, further comprising a sensing information storage unit storing the information from the electronic component detecting unit and the sprocket hole detecting unit and, wherein the determination unit determines presence or absence of an electronic component in the accommodation section based on the information stored in the sensing information storage unit.

10. The electronic component supply apparatus according to claim 1,
wherein the sprocket hole detecting unit is an optical sensor.

* * * * *